(12) United States Patent
Maeda et al.

(10) Patent No.: US 8,351,211 B2
(45) Date of Patent: Jan. 8, 2013

(54) ATTACHMENT STRUCTURE OF AN ATTACHED-PLATE OF A SUBSTRATE

(75) Inventors: Shinichi Maeda, Osaka (JP); Yasue Chihara, Osaka (JP); Yuji Ariyoshi, Osaka (JP)

(73) Assignee: Panasonic Corporation, Osaka (JP)

( * ) Notice: Subject to any disclaimer, the term of this patent is extended or adjusted under 35 U.S.C. 154(b) by 872 days.

(21) Appl. No.: 12/186,684

(22) Filed: Aug. 6, 2008

(65) Prior Publication Data

US 2009/0046438 A1    Feb. 19, 2009

(30) Foreign Application Priority Data

Aug. 7, 2007 (JP) ................................ 2007-205106

(51) Int. Cl.
*H05K 5/00* (2006.01)
*H05K 7/00* (2006.01)

(52) U.S. Cl. ....................................... 361/752; 361/760
(58) Field of Classification Search .................. 361/748, 361/750, 752, 753, 756, 758, 759, 760, 767, 361/770, 784, 790, 792, 807; 211/26, 41.17
See application file for complete search history.

(56) References Cited

U.S. PATENT DOCUMENTS

| | | | |
|---|---|---|---|
| 4,473,204 A | | 9/1984 | Böhm |
| 4,713,714 A | * | 12/1987 | Gatti et al. ..................... 360/137 |
| 6,078,498 A | * | 6/2000 | Eckerd et al. ............. 361/679.31 |
| 6,144,557 A | * | 11/2000 | Chen et al. ..................... 361/704 |
| 6,347,954 B1 | | 2/2002 | Jones et al. |
| 6,362,968 B1 | * | 3/2002 | Lajara et al. ................... 361/752 |
| 6,424,540 B1 | * | 7/2002 | Chen et al. ..................... 361/759 |
| 6,695,629 B1 | * | 2/2004 | Mayer ............................. 439/92 |
| 6,741,460 B2 | * | 5/2004 | Huang ..................... 361/679.58 |
| 6,761,273 B1 | * | 7/2004 | Chen et al. ................. 211/41.17 |
| 6,762,932 B2 | * | 7/2004 | Regimbal et al. ........ 361/679.33 |
| 6,781,055 B2 | * | 8/2004 | Chen ............................. 174/535 |

(Continued)

FOREIGN PATENT DOCUMENTS

CN    1335691    2/2002

(Continued)

OTHER PUBLICATIONS

Chinese Office Action issued Sep. 30, 2011 in corresponding Chinese Application No. 200810176935.X (with English translation).

*Primary Examiner* — Adrian S Wilson
(74) *Attorney, Agent, or Firm* — Wenderoth, Lind & Ponack, L.L.P.

(57) ABSTRACT

In an attachment structure for attaching an attached-plate to a printed substrate which is installed in a mechanical chassis, the mechanical chassis includes a positioning pin for positioning the printed substrate; and the attached-plate includes a guide groove that engages with the positioning pin and is slidably guided in a predetermined path, a fixing portion to the printed substrate, and an engaging portion that engages with a side portion of the printed substrate. By causing the attached-plate to slide along a substrate side of the printed substrate with the guide groove being engaged with the positioning pin, the guide groove is guided by the positioning pin, whereby the engaging portion engages with the side portion of the printed substrate. In the engagement state, by fixing the fixing portion of the attached-plate to the printed substrate, the attached-plate is attached to the printed substrate.

21 Claims, 8 Drawing Sheets

U.S. PATENT DOCUMENTS

| | | | |
|---|---|---|---|
| 6,799,980 B2 * | 10/2004 | Bloomfield et al. | 439/92 |
| 6,804,123 B1 * | 10/2004 | Cheng | 361/784 |
| 6,809,933 B2 | 10/2004 | Kuchiishi et al. | |
| 6,865,091 B2 * | 3/2005 | Hsu | 361/801 |
| 6,964,581 B2 * | 11/2005 | Chen et al. | 439/547 |
| 7,040,905 B1 * | 5/2006 | Wang | 439/76.1 |
| 7,072,176 B2 * | 7/2006 | Lin et al. | 361/679.02 |
| 7,104,805 B2 * | 9/2006 | Hjort et al. | 439/74 |
| 7,227,761 B2 * | 6/2007 | Estes et al. | 361/810 |
| 7,364,442 B2 * | 4/2008 | Bang et al. | 439/92 |
| 7,385,830 B2 * | 6/2008 | Liu et al. | 361/810 |
| 7,447,044 B2 * | 11/2008 | Xu | 361/803 |
| 7,639,506 B2 * | 12/2009 | Chen et al. | 361/747 |
| 7,835,156 B2 * | 11/2010 | Kubokawa et al. | 361/760 |
| 2002/0181191 A1 * | 12/2002 | Huang | 361/683 |
| 2003/0007333 A1 * | 1/2003 | Kuchiishi et al. | 361/752 |
| 2004/0034994 A1 * | 2/2004 | Chang | 29/760 |
| 2004/0125575 A1 * | 7/2004 | Chen et al. | 361/759 |
| 2005/0079748 A1 * | 4/2005 | Kim | 439/92 |
| 2005/0128723 A1 * | 6/2005 | Chen et al. | 361/801 |
| 2005/0180121 A1 * | 8/2005 | Chen et al. | 361/752 |
| 2005/0190544 A1 * | 9/2005 | Chen et al. | 361/801 |
| 2005/0190546 A1 * | 9/2005 | Chen et al. | 361/807 |
| 2006/0114662 A1 * | 6/2006 | Liu et al. | 361/759 |
| 2006/0198112 A1 * | 9/2006 | Miller et al. | 361/752 |
| 2008/0137281 A1 * | 6/2008 | Chen et al. | 361/685 |
| 2009/0073651 A1 * | 3/2009 | Hu et al. | 361/679.58 |

FOREIGN PATENT DOCUMENTS

| | | |
|---|---|---|
| JP | 56-120199 | 9/1981 |
| JP | 59-63489 | 4/1984 |
| JP | 63-200391 | 12/1988 |
| JP | 7-297572 | 11/1995 |
| JP | 2001-291978 | 10/2001 |
| JP | 2002-280775 | 9/2002 |

* cited by examiner

ATTACHMENT STRUCTURE OF AN ATTACHED-PLATE OF A SUBSTRATE

BACKGROUND OF THE INVENTION

I. Technical Field

The present invention relates to an attachment structure of an attached-plate of a substrate, and more particularly, to an attachment structure of an attached-plate of a substrate for attaching attached-plates, such as a heat sink plate and a ground plate, of a printed substrate which is installed in a chassis of an electrical appliance, e.g., a disk apparatus, to the printed substrate.

II. Description of the Related Art

As is known, to a printed substrate which is installed in a chassis of an electrical appliance, e.g., a disk apparatus, is normally attached a metal heat sink plate, a so-called heat sink, to promote the heat sinking of temperature-rise elements, such as modules, arranged on the printed substrate (see, for example, Japanese Patent Laid-Open Publication No. 2002-280775 and Japanese Utility Model Laid-Open Publication No. 63-200391). In addition to the heat sink plate, a metal ground plate is attached to the printed substrate to ground the printed substrate.

For an attachment structure for attaching attached-plates which are attached to a printed substrate, such as a heat sink plate and a ground plate, to the printed substrate, for example, Japanese Patent Laid-Open Publication No. 2002-280775 discloses an attachment structure of a heat sink plate for attaching a heat sink plate to a printed substrate by inserting a leg portion of the heat sink plate into an attachment hole of the printed substrate. In the attachment structure, after the insertion of the leg portion into the attachment hole, a latching leg portion formed on the terminal side of the leg portion is forcefully turned over and is thereby latched in the attachment hole so as not to come off, whereby the leg portion is positioned and fixed into the attachment hole.

Also, the aforementioned Japanese Utility Model Laid-Open Publication No. 63-200391 discloses a configuration in which with an electronic component being sandwiched between a plane portion of a heat sink and a holding plate, screws are screwed into screw holes provided in each of the heat sink and the holding plate, whereby the electronic component is fixed.

Problems to be Solved by the Invention

However, in the configuration disclosed in Japanese Patent Laid-Open Publication No. 2002-280775, when the heat sink plate is attached to the printed substrate, the latching leg portion which is a part of the leg portion of the heat sink plate needs to be deformed, resulting in application of undue force to the leg portion of the heat sink plate and the attachment hole of the printed substrate. On the other hand, the configuration disclosed in Japanese Utility Model Laid-Open Publication No. 63-200391 has a drawback in that in addition to the heat sink the holding plate as an extra component is additionally required.

SUMMARY OF THE INVENTION

The present invention is made in view of such conventional technical problems. And a basic object of the present invention is therefore to enable attached-plates, such as a heat sink plate and a ground plate, to be attached to a printed substrate without exerting undue force to the heat sink plate and the printed substrate and without requiring an additional extra component.

Hence, according to one aspect of the present invention, there is provided an attachment structure of an attached-plate of a substrate for attaching an attached-plate of a printed substrate which is installed in a chassis, to the printed substrate, wherein the chassis includes a positioning pin for positioning at least the printed substrate with respect to the chassis;

the attached-plate includes a guide groove of a predetermined shape that engages with the positioning pin and is slidably guided by the positioning pin in a predetermined path, an attached-plate fixing portion that fixes the attached-plate to the printed substrate, and an engaging portion that engages with a side portion of the printed substrate;

by causing the attached-plate to slide along one side of the printed substrate with the guide groove being engaged with the positioning pin, the guide groove is guided by the positioning pin in the predetermined path, whereby the engaging portion engages with the side portion of the printed substrate; and in the engagement state, by fixing the attached-plate fixing portion to the printed substrate, the attached-plate is attached to the printed substrate.

In this configuration, by causing the attached-plate to slide along one side of the printed substrate with the guide groove of the attached-plate being engaged with the positioning pin of the chassis, the guide groove is guided by the positioning pin in a predetermined path, whereby the engaging portion of the attached-plate engages with a side portion of the printed substrate. Then, in this engagement state, by fixing the attached-plate fixing portion to the printed substrate, the attached-plate is attached to the printed substrate.

In this case, it is preferable that in a portion of the printed substrate corresponding to the attached-plate fixing portion be provided a pass-through hole that allows an attached-plate fixing screw member to pass therethrough, and in a portion of the chassis corresponding to the pass-through hole be provided a screw hole that allows the attached-plate fixing screw member to be screwed thereinto.

In this configuration, by allowing an attached-plate fixing screw member to pass through the pass-through hole of the printed substrate and then allowing the attached-plate fixing screw member to be screwed into the screw hole of the chassis, the attached-plate, the printed substrate, and the chassis are tightened together and fixed by a single screwing operation.

In this case, it is preferable that the attached-plate fixing portion for fixing the attached-plate to the printed substrate is located at a one-end side of the guide groove.

In this configuration, when the attached-plate is fixed to the printed substrate using the attached-plate fixing screw member, interference between the attached-plate fixing screw member and the positioning pin can be easily avoided.

In the above-described case, it is preferable that the chassis be accommodated in a casing, in respective portions of the casing and the printed substrate corresponding to the positioning pin be respectively provided positioning portions that are matched with the positioning pin, and the positioning pin engages with the guide groove and thereby guides a sliding operation of the attached-plate along the one side of the printed substrate and the positioning pin be matched with the positioning portions and thereby position the casing and the printed substrate with respect to the chassis.

In this configuration, mutual positioning of three of the casing, the chassis, and the printed substrate and guiding of a sliding operation of the attached-plate along the one side of the printed substrate can be performed with a single positioning pin, enabling to implement simplification of the structure and facilitation of the assembling operation.

In the above-described case, the engaging portion may include a leg portion that abuts and is secured to a side surface of the printed substrate when engaging with the side portion of the printed substrate; and a latching hook that is latched to an other side of the printed substrate upon the engagement, and when the engaging portion engages with the side portion of the printed substrate, in a positioning state where the leg portion abuts and is secured to the side surface of the printed substrate from a side, the latching hook may be latched to the other side of the printed substrate.

In this case, by the engaging portion including the leg portion and the latching hook, positioning of the attached-plate in the plane parallel to a substrate surface of the printed substrate and positioning of the attached-plate in a thickness direction of the printed substrate can be securely performed with a simple configuration.

In this case, it is preferable that the engaging portion be provided at predetermined three locations of the attached-plate and positions of the engaging portions at the three locations be set such that the engaging portions are not arranged on one straight line.

In this configuration, by the attached-plate engaging with the printed substrate at three locations whose positions are set such that they are not arranged on one straight line, a surface of the attached-plate facing the printed substrate is properly positioned as one plane defined by the three locations (three points).

In this case, at least one of the engaging portions may further include a sliding wall portion that slides along an other side of the printed substrate, and when the engaging portions engage with side portions of the printed substrate, in a positioning state where the leg portions abut and are secured to side surfaces of the printed substrate from a side, the sliding wall portion and the latching hook may sandwich at least the printed substrate in a thickness direction.

In this case, by the engaging portion including the leg portion, the latching hook, and the sliding wall portion, positioning of the attached-plate in the plane parallel to a substrate surface of the printed substrate and positioning of the attached-plate in a thickness direction of the printed substrate can be more properly and stably performed.

In the above-described case, the chassis may be made of a resin and the attached-plate may be a metal heat sink plate that promotes heat sinking of a temperature-rise element on the printed substrate.

In this case, the above-described functions and effects can be obtained when the heat sink plate is attached to the printed substrate.

In this case, it is preferable that in a portion of the heat sink plate corresponding to the temperature-rise element be disposed an elastic element that comes into contact with a surface of the temperature-rise element and thereby promotes heat sinking of the temperature-rise element.

In this configuration, dimensional error in the gap between the temperature-rise element on the printed substrate and the heat sink plate can be absorbed within the elastic range of the elastic element.

In this case, the elastic element may be formed in a sheet-like or film-like form.

In this configuration, since the elastic element can be formed to be thin-walled, the temperature gradient of the elastic element itself located between the temperature-rise element and the heat sink plate is increased, enabling to promote the heat sinking of the temperature-rise element. In addition, the attachment structure of the attached-plate of the printed substrate can be made compact (made thinner). Moreover, the amount of material used for the elastic element is small, also enabling to contribute to a cost reduction.

Furthermore, in this case, it is preferable that the engaging portion that engages with the side portion of the printed substrate be provided at predetermined three locations of the attached-plate and positions of the engaging portions at the three locations be set such that the engaging portions are not arranged on one straight line.

In this case, by the attached-plate engaging with the printed substrate at three locations whose positions are set such that they are not arranged on one straight line, a surface of the attached-plate facing the printed substrate is properly positioned as one plane defined by the three locations (three points). Thus, dimensional error in the gap between the temperature-rise element on the printed substrate and the heat sink plate can be made smaller. Even when the elastic element is made to be thin-walled, dimensional error can be effectively absorbed within the elastic range of the elastic element.

The chassis may be made of a resin and be accommodated in a metal casing; in the chassis may be provided a pass-through hole that allows a chassis fixing metal screw member for fixing the chassis to the casing to pass therethrough; and in a portion of the casing corresponding to the pass-through hole may be provided a screw hole that allows the chassis fixing screw member to be screwed thereinto; in the heat sink plate are provided a conducting portion electrically connected to the printed substrate, and an extended portion extending a perimeter of the pass-through hole of the chassis; and by allowing the chassis fixing screw member to pass through the pass-through hole of the chassis and allowing the chassis fixing screw member to be screwed into the screw hole of the casing, the printed substrate may be electrically connected to the casing and grounded through the extended portion of the heat sink plate and the chassis fixing screw member.

In this case, using the heat sink plate, the printed substrate is electrically connected to the casing and grounded. That is, the heat sink plate is also used as a ground plate.

Alternatively, the chassis may be made of a resin and be accommodated in a metal casing; the attached-plate may be a metal ground plate that grounds the printed substrate; in the chassis may be provided a pass-through hole that allows a chassis fixing metal screw member for fixing the chassis to the casing to pass therethrough; and in a portion of the casing corresponding to the pass-through hole may be provided a screw hole that allows the chassis fixing screw member to be screwed thereinto; in the ground plate are provided a conducting portion electrically connected to the printed substrate, and an extended portion extending a perimeter of the pass-through hole; and by allowing the chassis fixing screw member to pass through the pass-through hole of the chassis and allowing the chassis fixing screw member to be screwed into the screw hole of the casing, the printed substrate may be electrically connected to the casing and grounded through the ground plate and the chassis fixing screw member.

In this configuration, by allowing the chassis fixing screw member to pass through the pass-through hole of the chassis and then allowing the chassis fixing screw member to be screwed into the screw hole of the casing, the ground plate, the printed substrate, and the chassis are tightened together and fixed by a single screwing operation and the printed substrate is electrically connected to the casing and grounded through the ground plate and the chassis fixing screw member.

According to another aspect of the present invention, there is provided an attachment structure of an attached-plate of a substrate including: a chassis having a positioning pin; a printed substrate fixed to the chassis with the printed substrate being positioned by the positioning pin; and an attached-plate fixed onto the printed substrate with the attached-plate being positioned by the positioning pin.

In this configuration, the printed substrate is fixed to the chassis with the printed substrate being positioned by the positioning pin provided to the chassis and the attached-plate is fixed onto the printed substrate with the attached-plate being positioned by the positioning pin. That is, positioning of the printed substrate with respect to the chassis and positioning of the attached-plate with respect to the printed substrate both can be performed with a single positioning pin provided to the chassis.

According to the attachment structure of an attached-plate of a substrate according to the present invention, by causing the attached-plate to slide along one side of the printed substrate with the guide groove of the attached-plate being engaged with the positioning pin of the chassis, the guide groove is guided by the positioning pin in a predetermined path, whereby the engaging portion of the attached-plate engages with a side portion of the printed substrate. With this configuration, by using the positioning pin which is originally provided to the chassis and the side portion of the printed substrate, the attached-plate can be accurately positioned with respect to the printed substrate by a simple operation.

Then, by fixing the attached-plate fixing portion to the printed substrate with the engaging portion of the attached-plate engaging with the side portion of the printed substrate, the attached-plate can be easily attached to the printed substrate. In the above-described attachment operation, the heat sink plate and the printed substrate are not subjected to undue force and an additional extra component is not required.

BRIEF DESCRIPTION OF THE DRAWINGS

The present invention will be described in greater detail with reference to the accompanying drawings.

DETAILED DESCRIPTION OF THE INVENTION

An embodiment of the present invention will be described below using an example in which a heat sink plate and a ground plate are attached to a printed substrate which is installed in a chassis of a disk apparatus, with reference to the accompanying drawings.

Figure 1:
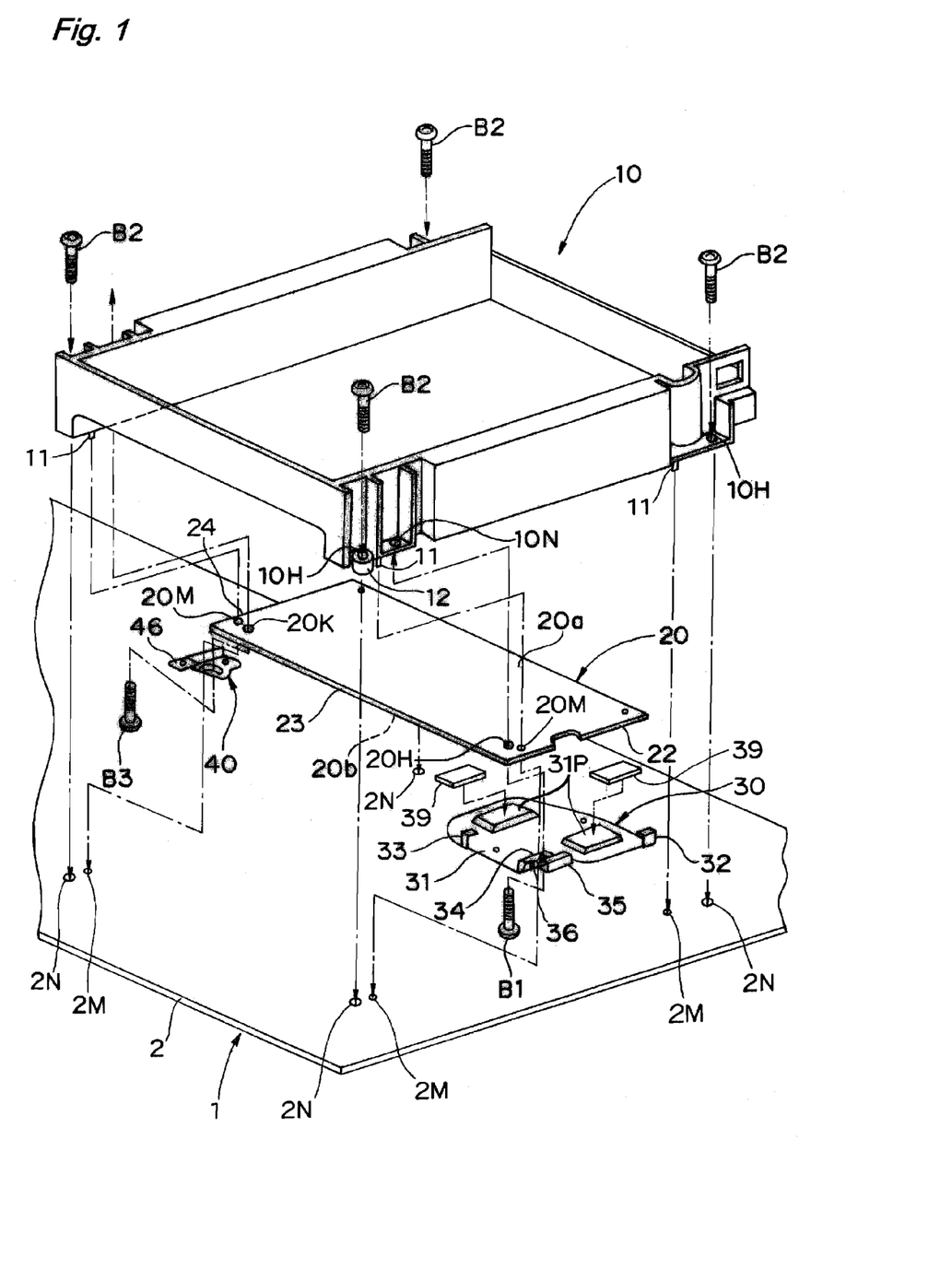
FIG. 1 is an exploded perspective view of a mechanical chassis, a printed substrate, a heat sink plate, and a ground plate of a disk apparatus before assembling, according to an embodiment of the present invention.

FIG. 1 is an exploded perspective view of so-called mechanical chassis 10, printed substrate 20, heat sink plate 30, and ground plate 40 of a disk apparatus before assembling, according to an embodiment of the present invention.

The mechanical chassis 10 installs and accommodates primary internal components of the disk apparatus. The mechanical chassis 10 is formed using, for example, a synthetic resin material such that its whole shape is box-like with the upper side being open. On the bottom side of the mechanical chassis 10 is installed the printed substrate 20 having formed thereon a control circuit, etc., for drive-controlling the disk apparatus. After required internal components are installed in the mechanical chassis 10, the mechanical chassis 10 is accommodated in a metal casing 1. FIG. 1 shows only a part (e.g., a bottom plate 2) of the casing 1.

In the printed substrate 20, in order to promote the heat sinking of temperature-rise elements on the substrate 20, the metal heat sink plate 30 is attached to a bottom surface 20b side of the printed substrate 20. In this case, as temperature-rise elements that particularly need promotion of heat sinking, two modules (not shown), for example, are selected, and on the heat sink plate 30 two protrusions 31p protruding upward by a predetermined amount are formed to correspond to the shapes and arrangement positions of the modules. Onto top surfaces of the protrusions 31p and 31p are respectively affixed elastic elements 39 and 39 (e.g., rubber sheets with an excellent heat sink property) that come into contact with surfaces of the modules when the heat sink plate 30 is attached to the printed substrate 20, and thereby promote the heat sinking of the modules.

Also, the metal ground plate 40 is attached to the printed substrate 20 to ground the printed substrate 20. Both of the ground plate 40 and the heat sink plate 30 are types of attached-plates to be attached to the printed substrate 20 and are obtained by press-forming a metal sheet material with a predetermined thickness into a predetermined shape.

Next, an attachment structure of the attached-plates 30 and 40 to the printed substrate 20 will be described.

First, an attachment structure of the heat sink plate 30 will be described with reference to the aforementioned FIG. 1 and FIGS. 2 to 6.

Figure 2:
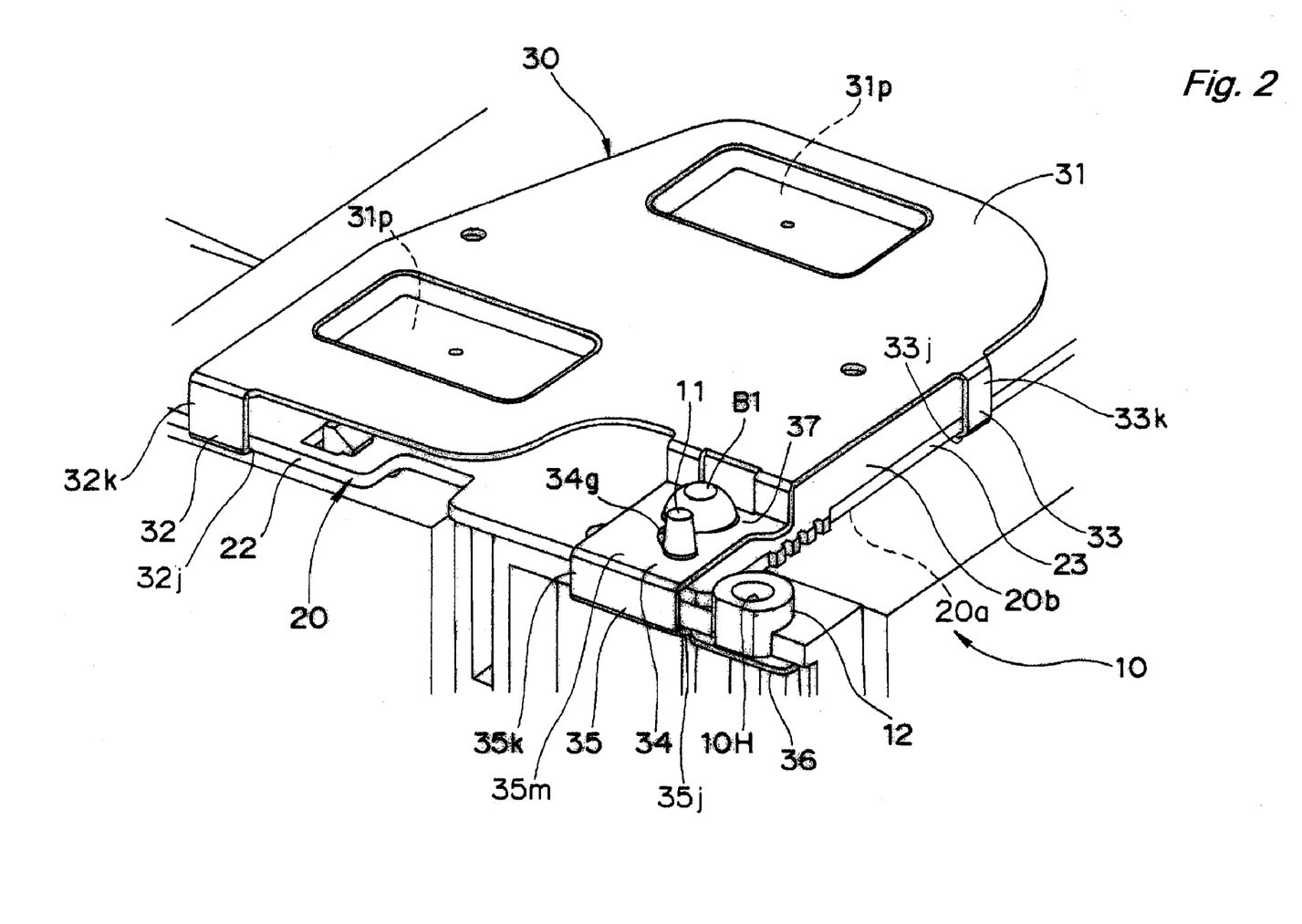
FIG. 2 is a perspective view showing an attachment state of the heat sink plate to the printed substrate as viewed from the bottom surface side of the substrate.

FIG. 2 is a perspective view showing an attachment state of the heat sink plate 30 to the printed substrate 20 as viewed from the bottom surface 20b side of the substrate 20. FIGS. 3 to 6 are a series of perspective views for describing a process of attaching the heat sink plate 30 to the printed substrate 20. Since FIGS. 2 to 6 show the heat sink plate 30 and the printed substrate 20 as viewed from the bottom surface 20b side of the printed substrate 20, the heat sink plate 30 and the printed substrate 20 are shown upside down from their actual top-down position (i.e., FIG. 1).

As is very clear from FIG. 2, the heat sink plate 30 according to the present embodiment includes a plate-like cover portion 31 having the protrusions 31p and covering a predetermined region of the bottom surface of the printed substrate 20; first and second engaging portions 32 and 33 that respectively engage with two side portions 22 and 23 of the substrate 20 crossing at right angles, when the heat sink plate 30 is attached to the printed substrate 20; and an attachment base portion 34 serving as a base for attaching and fixing the heat sink plate 30 to the printed substrate 20.

The attachment base portion 34 is configured as a plate portion that is stepped up from the cover portion 31 toward the bottom surface 20b side of the printed substrate 20 by a predetermined amount, to contact with or abut on the bottom surface 20b of the printed substrate 20. On the terminal side of the attachment base portion 34 opposite the step portion is formed a third engaging portion 35 that engages with any one of the side portions 22 and 23 of the printed substrate 20 (in this case, the side portion 22 with which the first engaging portion 32 engages). Namely, the positions of the first, second, and third engaging portions 32, 33, and 35 are set such that they are not arranged on one straight line. Note that both the first and second engaging portions 32 and 33 are also formed to be stepped up from the cover portion 31 toward the bottom surface 20b side of the printed substrate 20 by a predetermined amount.

As such, the engaging portions 32, 35, and 33 engaging with the side portions 22 and 23 of the printed substrate 20 are provided at predetermined three locations of the heat sink plate 30 and the positions of the engaging portions 32, 35, and 33 at the three locations are set such that they are not arranged on one straight line; accordingly, a surface of the heat sink plate 30 facing the printed substrate 20 is properly positioned as one plane defined by the three locations (three points) that are not arranged on one straight line.

The first and second engaging portions 32 and 33 respectively have leg portions 32k and 33k that abut and are secured to side surfaces of the printed substrate 20 when engaging with the side portions 22 and 23 of the printed substrate 20. At the respective tips of the leg portions 32k and 33k, latching hooks 32j and 33j that are latched to the top surface 20a of the printed substrate 20 are integrally formed. Note that the top surface 20a and the bottom surface 20b of the printed substrate 20 are parallel to each other.

When the first and second engaging portions 32 and 33 engage with the side portions 22 and 23 of the printed substrate 20, the latching hooks 32j and 33j are latched to the top surface 20a of the printed substrate 20 with the leg portions 32k and 33k abutting and being secured to the side surfaces of the printed substrate 20, whereby positioning in the plane parallel to the top surface 20a of the printed substrate 20 and positioning in a thickness direction of the printed substrate 20 can be securely performed with a simple configuration.

On the other hand, the third engaging portion 35 has a leg portion 35k and a latching hook 35j which are similar to those of the first and second engaging portions 32 and 33, and a part of the attachment base portion 34 configures a sliding wall portion 35m that slides along the bottom surface 20b of the printed substrate 20.

When the third engaging portion 35 engages with the side portion 22 of the printed substrate 20, in a positioning state where the leg portion 35k abuts and is secured to the side surface of the printed substrate 20 from the side, the sliding wall portion 35m and the latching hook 35j sandwich at least the printed substrate 20 (in this case, a part of the printed substrate 20 and the chassis 10) in the thickness direction.

In this case, by the third engaging portion 35 having the leg portion 35k, the latching hook 35j, and the sliding wall portion 35m, positioning of the attached-plate 30 in the plane parallel to the top surface 20a and the bottom surface 20b of the printed substrate 20 is performed and positioning of the attached-plate 30 in the thickness direction of the printed substrate 20 can be more properly and stably performed.

In the present embodiment, more preferably, an extended portion 36 is provided so as to extend from the latching hook 35j of the third engaging portion 35 of the attachment base 34 in parallel with the latching hook 35j. As will be described later, the extended portion 36 configures a ground portion that grounds the printed substrate 20.

Note that in the present embodiment, as is also shown in FIG. 1, the dedicated ground plate 40 is attached, and thus, it is not indispensable to provide the double-use ground portion 36 to the heat sink plate 30 in addition to the ground plate 40, and the printed substrate 20 can be securely grounded only by the dedicated ground plate 40. Alternatively, conversely, without attaching the dedicated ground plate 40, the printed substrate 20 can be securely grounded only by the double-use ground portion 36 provided to the heat sink plate 30.

In the mechanical chassis 10, a plurality of positioning pins 11 that position at least the printed substrate 20 (in the present embodiment, three of the casing 1, the mechanical chassis 10, and the printed substrate 20 are positioned relative to each other) are provided on the bottom surface side in a protruding manner. In the printed substrate 20, positioning holes 20M that allow the positioning pins 11 to pass therethrough are provided at predetermined locations.

As shown in FIGS. 3 to 6, in the attachment base portion 34 of the heat sink plate 30 is provided a guide groove 34g of a predetermined shape that allows the positioning pin 11 to pass therethrough to engage therewith and is slidably guided by the positioning pin 11 in a predetermined path. In the present embodiment, the guide groove 34g is configured such that a center line thereof forms a part of an arc with a predetermined radius or a polygonal line with a predetermined angle.

In addition, in the attachment base portion 34 of the heat sink plate 30, a fixing portion 37 that fixes the heat sink plate 30 to the printed substrate 20 is provided. In a portion of the printed substrate 20 corresponding to the fixing portion 37 is provided a pass-through hole 20H that allows a heat sink plate fixing screw B1 to pass therethrough. In a portion of the chassis 10 corresponding to the pass-through hole 20H is provided a screw hole 10N that allows the heat sink plate fixing screw B1 to be screwed thereinto. The groove width of the guide groove 34g of the heat sink plate 30 is also set such that the heat sink plate fixing screw B1 is allowed to pass through the guide groove 34g.

Figure 3:
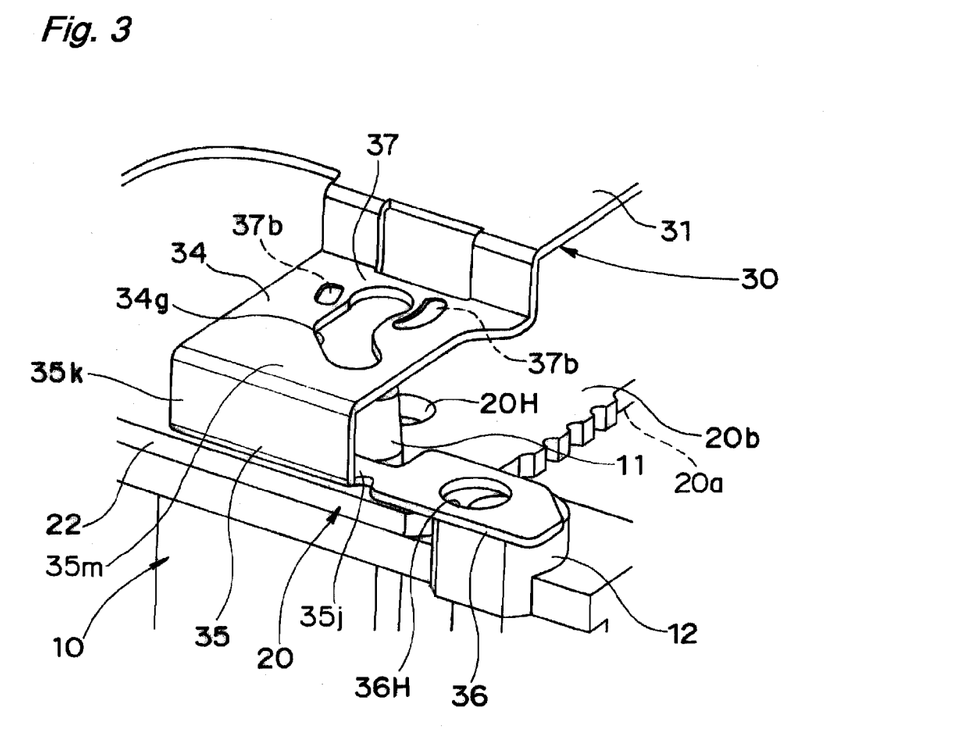
FIG. 3 is one of a series of perspective views for describing a process of attaching the heat sink plate to the printed substrate.
Figure 4:
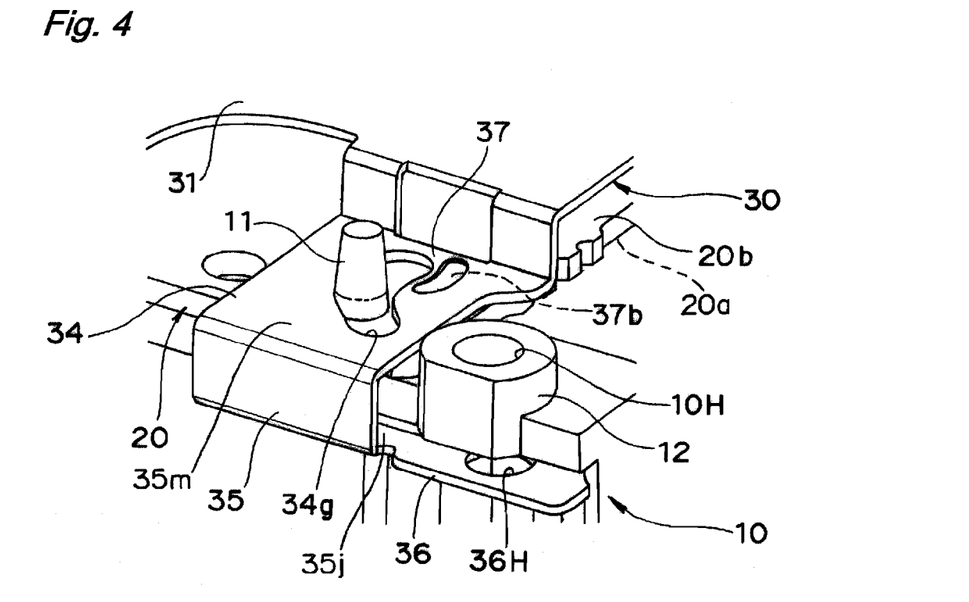
FIG. 4 is one of a series of perspective views for describing the process of attaching the heat sink plate to the printed substrate.

The fixing portion 37 of the heat sink plate 30 is preferably located close to an inner end portion of the guide groove 34g, and has a pair of bulges 37b that are correspond to a screw head portion of the heat sink plate fixing screw B1, and bulge on the side of the printed substrate 20 (when viewed from the opposite direction, as shown in FIGS. 3 and 4, the bulges 37b are "recessed"). In regions of the printed substrate 20 corresponding to the bulges 37b, a terminal (not shown) of a ground circuit of the printed substrate 20 is formed. By the bulges 37b coming into contact on the terminal, the attachment base portion 34 (i.e., the heat sink plate 30) is electrically connected to the ground circuit of the printed substrate 20. In this case, the bulges 37b configure conducting portions that are electrically connected to the printed substrate 20.

On the other hand, in the mechanical chassis 10, pass-through holes 10H that allow chassis fixing metal screws B2 (see FIG. 1) for fixing the chassis 10 to the bottom plate 2 of the casing 1 to pass therethrough are provided at a plurality of required locations (in the present embodiment, four locations, for example). In portions of the bottom plate 2 of the casing 1 corresponding to the pass-through holes 10H, screw holes 2N that allow the chassis fixing screws B2 to be screwed thereinto are provided.

The ground portion 36 of the heat sink plate 30 extends to a perimeter of the pass-through hole 10H of the mechanical chassis 10, i.e., an end surface of a boss 12 in which the corresponding pass-through hole 10H is provided, and has a pass-through hole 36H (see FIG. 3) that allows the chassis fixing screw B2 to pass therethrough.

In portions of the bottom plate 2 of the casing 1 corresponding to the respective positioning pins 11 provided to the mechanical chassis 10 are provided positioning holes 2M. In portions of the bottom plate 2 of the casing 1 corresponding to the pass-through holes 10H of the mechanical chassis 10, the plurality of screw holes 2N that allow the chassis fixing screws B2 to be screwed thereinto are provided.

By allowing the chassis fixing screw B2 to pass through the pass-through hole 36H of the ground portion 36 and the corresponding pass-through hole 10H of the mechanical chassis 10 and screwing the chassis fixing screw B2 into the screw hole 2N of the bottom plate 2 of the casing 1 and tightening the chassis fixing screw B2, the mechanical chassis 10 can be fastened and fixed to the bottom plate 2 of the casing 1 with the ground portion 36 of the heat sink plate 30 being sandwiched between a screw head portion of the chassis fixing screw B2 and the end surface of the boss 12.

With this configuration, the ground circuit of the printed substrate 20 is electrically connected to the casing 1 and grounded through the ground portion 36 and the chassis fixing screw B2.

An attachment procedure for attaching the heat sink plate 30 configured in the above-described manner to the printed substrate 20 will be described.

In an assembling position where the bottom side of the mechanical chassis 10 and the bottom surface 20b of the printed substrate 20 are disposed to face upward, first, the heat sink plate 30 is brought above the bottom surface 20b of the printed substrate 20 (see FIG. 3). From this state, the positioning pins 11 of the mechanical chassis 10 are allowed to pass through the positioning holes 20M of the printed substrate 20 and then the positioning pin 11 is allowed to pass through the guide groove 34g of the attachment base portion 34 of the heat sink plate 30 and to be engaged therewith, and the heat sink plate 30 is shifted to be along the bottom surface 20b of the printed substrate 20 such that the respective hook tips of the first, second, and third engaging portions 32, 33, and 35 and the ground portion 36 are located at outer portions corresponding to the top surface 20a of the printed substrate 20 and a top end surface of a boss 12 of the mechanical chassis 10 (see FIG. 4). In this state, the positioning pin 11 of the mechanical chassis 10 is located, for example, on the way in a longitudinal direction of the guide groove 34g of the heat sink plate 30.

Then, with the guide groove 34g thus being engaged with the positioning pin 11, the heat sink plate 30 (more specifically, the attachment base plate 34) is caused to slide along the bottom surface 20b of the printed substrate 20. With this configuration, the guide groove 34g is guided by the positioning pin 11 in a predetermined path and the first and second engaging hooks 32 and 33 engage with the side portions 22 and 23 of the printed substrate 20 (see FIG. 5).

Figure 5:
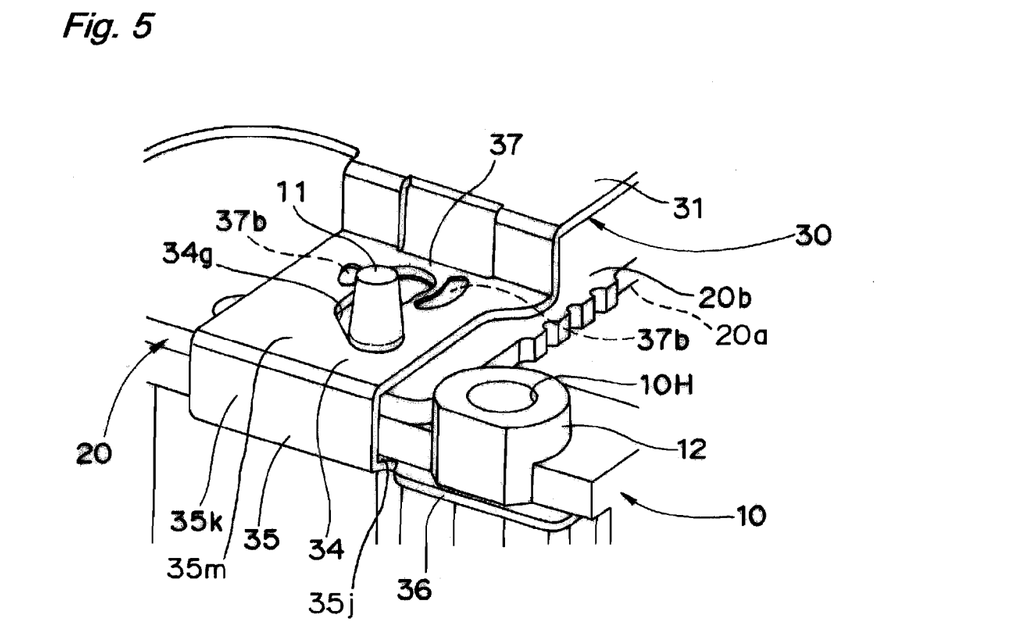
FIG. 5 is one of a series of perspective views for describing the process of attaching the heat sink plate to the printed substrate.

At this time, the heat sink plate 30 is continuously caused to slide until the leg portions 32k and 33k of the first and second engaging hooks 32 and 33 abut and are secured to the side portions 22 and 23 of the printed substrate 20 and until the leg portion 35k of the third engaging hook 35 abuts and is secured to the side portion 22 of the printed substrate 20. With this configuration, the attachment position and direction of the heat sink plate 30 with respect to the printed substrate 20 can be accurately and easily set. At this time, the positioning pin 11 is set to be located close to an outer end portion of the guide groove 34g (i.e., an end portion on the side away from the fixing portion 37 of the heat sink plate 30).

Figure 6:
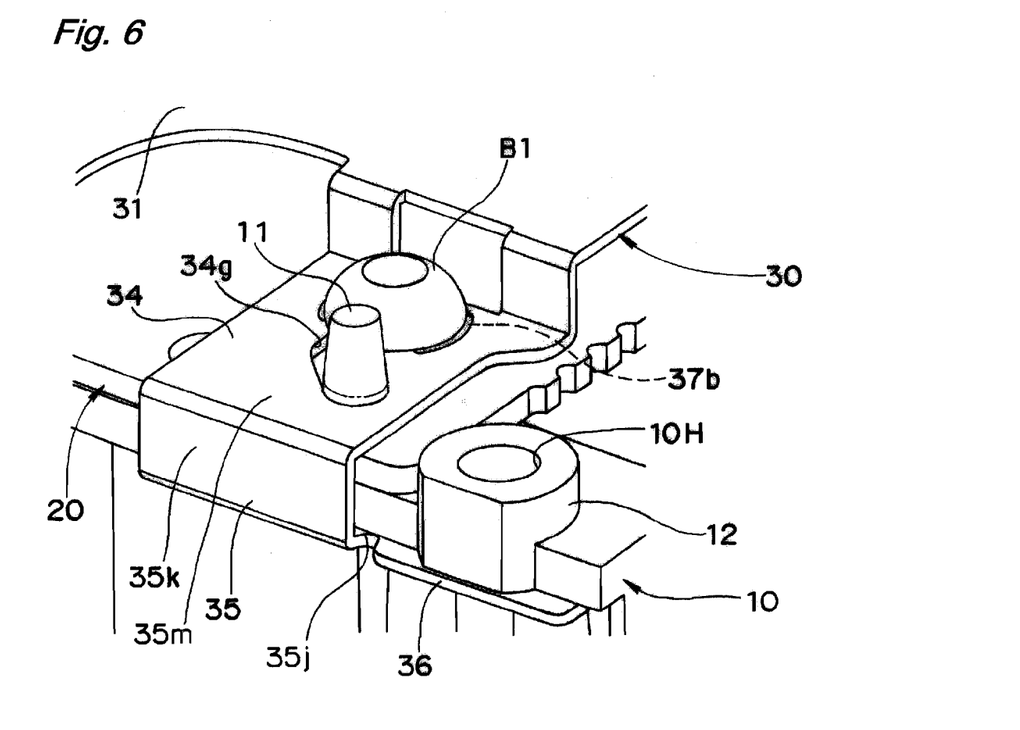
FIG. 6 is one of a series of perspective views for describing the process of attaching the heat sink plate to the printed substrate.

Then, in such a positioning state, the heat sink plate fixing screw B1 is allowed to sequentially pass through the guide groove 34g of the heat sink plate 30 and the pass-through hole 20H of the printed substrate 20 and to be screwed into the screw hole 10N of the mechanical chassis 10 and tightened (see FIGS. 6 and 2). With this configuration, the fixing portion 37 of the heat sink plate 30 is fixed to the printed substrate 20 and the heat sink plate 30 is attached to the printed substrate 20.

In this case, the heat sink plate 30, the printed substrate 20, and the mechanical chassis 10 can be tightened together and fixed by a single screwing operation using the heat sink plate fixing screw B1, enabling to simplify a heat sink plate fixing operation.

At this time, the positioning pin 11 is located close to the outer end portion of the guide groove 34g while the fixing portion 37 of the heat sink plate 30 is located close to the inner end portion of the guide groove 34g. Therefore, interference between the heat sink plate fixing screw B1 and the positioning pin 11 can be easily and securely avoided, when the heat sink plate 30 is fixed to the printed substrate 20 using the heat sink plate fixing screw B1.

In this attachment state, as described above, the elastic elements 39 (e.g., rubber sheets with an excellent heat sink property) that come into contact with the surfaces of modules, which are heat sink promotion targets, when the heat sink plate 30 is attached to the printed substrate 20 and thereby promote the heat sinking of the modules are affixed onto the top surfaces of the protrusions 31p of the heat sink plate 30. And thereby, dimensional error in the gap between the surfaces of the modules on the printed substrate 20 and the top surfaces of the protrusions 31p can be absorbed within the elastic range of the elastic elements 39. Then, the elastic elements 39 and the modules can securely come into contact with each other and an expected heat sink property can be ensured. Also, by using the elastic biasing force of the heat sink plate 30 within the elastic range of the elastic elements 39, so-called uplift of the heat sink plate 30 can be prevented without exerting an excessive burden on the modules which are heat sink promotion targets.

In this case, it is preferable that the elastic elements 39 be formed to be thin-walled within a range where the elastic elements 39 can achieve secure contact with the modules. Although the elastic elements 39 normally have a thickness of the order of about 2 to 3 mm or more, in the present embodiment, the elastic elements 39 are formed using, for example, a thin-walled silicon rubber sheet having a thickness of approximately 1 mm.

By forming the elastic elements 39 in such a thin-walled sheet-like form, the temperature gradient of the elastic elements 39 themselves located between the modules, which are temperature-rise elements, and the heat sink plate 30 is further increased, enabling to further promote the heat sinking of the modules. In addition, the attachment structure of the heat sink plate 30 to the printed substrate 20 can be made compact (made thinner). Moreover, the amount of material used for the elastic elements 39 is small, also enabling to contribute to a cost reduction. Note that the elastic elements 39 can be formed in a film-like form which is thinner than the sheet-like form or may be formed by applying a grease-like material onto the top surfaces of the protrusions 31p.

Note, however, that when the elastic elements 39 are made thin-walled, as described above, normally, a dimensional error absorption function brought about by elasticity degrades. Therefore, in the present embodiment, the engaging portions 32, 35, and 33 that engage with the side portions 22 and 23 of the printed substrate 20 are provided at predetermined three locations of the heat sink plate 30 and the positions of the engaging portions 32, 35, and 33 at the three locations are set such they are not arranged on one straight line. With this configuration, a surface of the heat sink plate 30 facing the printed substrate 20 is properly positioned as one plane defined by the three locations (three points) that are not arranged on one straight line.

Accordingly, dimensional error in the gap between the surfaces of the modules on the printed substrate 20 and the top surfaces of the protrusions 31p of the heat sink plate 30 is made smaller and thus can be controlled with high accuracy. Hence, even when thin-walled sheet-like elastic elements 39 of the order of about 1 mm or less are used, dimensional error can be effectively absorbed within the elastic range of the thin-walled sheet-like elastic elements 39. Then, the elastic elements 39 and the modules securely come into contact with each other and an expected heat sink property is ensured.

With the heat sink plate 30 being attached to the printed substrate 20 using the heat sink plate fixing screw B1 in the above-described manner (see FIGS. 6 and 2), the casing 1 (specifically, the bottom plate 2 of the casing 1) is positioned with respect to the mechanical chassis 10 and, as described above, the chassis fixing screws B2 are allowed to pass through the pass-through hole 36H of the ground portion 36 and the pass-through holes 10H of the mechanical chassis 10 and are screwed into the screw holes 2N of the bottom plate 2 of the casing 1 and tightened, whereby the mechanical chassis 10 is fastened and fixed to the bottom plate 2 of the casing 1 with the ground portion 36 of the heat sink plate 30 being sandwiched between a screw head portion of the chassis fixing screw B2 and the end surface of the boss 12.

With this configuration, the ground circuit of the printed substrate 20 is electrically connected to the casing 1 and grounded through the ground portion 36 of the heat sink plate 30 and the chassis fixing screw B2. That is, utilizing the heat sink plate 30, the printed substrate 20 is electrically connected to the casing 1 and grounded. As such, the heat sink plate 30 can also be used as a ground plate.

When the casing 1 (specifically, the bottom plate 2 of the casing 1) is positioned with respect to the mechanical chassis 10, at the attachment portion of the heat sink plate 30, the positioning pin 11 of the mechanical chassis 10 passes through the positioning hole 20M of the printed substrate 20 and then passes through the guide groove 34g of the attachment base portion 34 of the heat sink plate 30 and engages therewith. Then, furthermore, the positioning hole 2M provided in the bottom plate 2 of the casing 1 is matched with the tip side of the corresponding positioning pin 11.

Namely, in portions of the casing 1 and the printed substrate 20 corresponding to the positioning pin 11 are respectively provided the positioning holes 2M and 20M which are matched with the positioning pin 11. The positioning pin 11 passes through the guide groove 34g of the heat sink plate 30 and engages therewith and thereby guides a sliding operation of the heat sink plate 30 along one surface (bottom surface 20b) of the printed substrate 20. Also, the positioning pin 11 is matched with the positioning holes 2M and 20M and can thereby position the casing 1 and the printed substrate 20 with respect to the mechanical chassis 10.

By such a configuration, mutual positioning of three of the casing 1, the mechanical chassis 10, and the printed substrate 20 and guiding of a sliding operation of the heat sink plate 30 along the one surface 20b of the printed substrate 20 can be performed with a single positioning pin 11, enabling to implement simplification of the structure and facilitation of the assembling operation.

As described above, according to the present embodiment, by causing the heat sink plate 30 to slide along the bottom surface 20b of the printed substrate 20 with the guide groove 34g of the heat sink plate 30 being engaged with the positioning pin 11 of the mechanical chassis 10, the guide groove 34g is guided by the positioning pin 11 in a predetermined path and the engaging hooks 32, 33, and 35 of the heat sink plate 30 engage with the side portions 22 and 23 of the printed substrate 20. With this configuration, by utilizing the positioning pins 11 for positioning a printed substrate which are originally provided to the mechanical chassis 10 and the side portions 22 and 23 of the printed substrate 20, the heat sink plate 30 can be accurately positioned with respect to the printed substrate 20 by a simple operation.

Then, by fixing the fixing portion 37 of the heat sink plate 30 to the printed substrate 20 with the engaging hooks 32, 33, and 35 of the heat sink plate 30 engaging with the side portions 22 and 23 of the printed substrate 20, the heat sink plate 30 can be easily attached to the printed substrate 20. In the above-described attachment operation, the heat sink plate 30 and the printed substrate 20 are not subjected to undue force and an additional extra component is not required.

Next, an attachment structure of the ground plate 40 will be described with reference to the aforementioned FIG. 1 and FIGS. 7 to 11.

Figure 7:
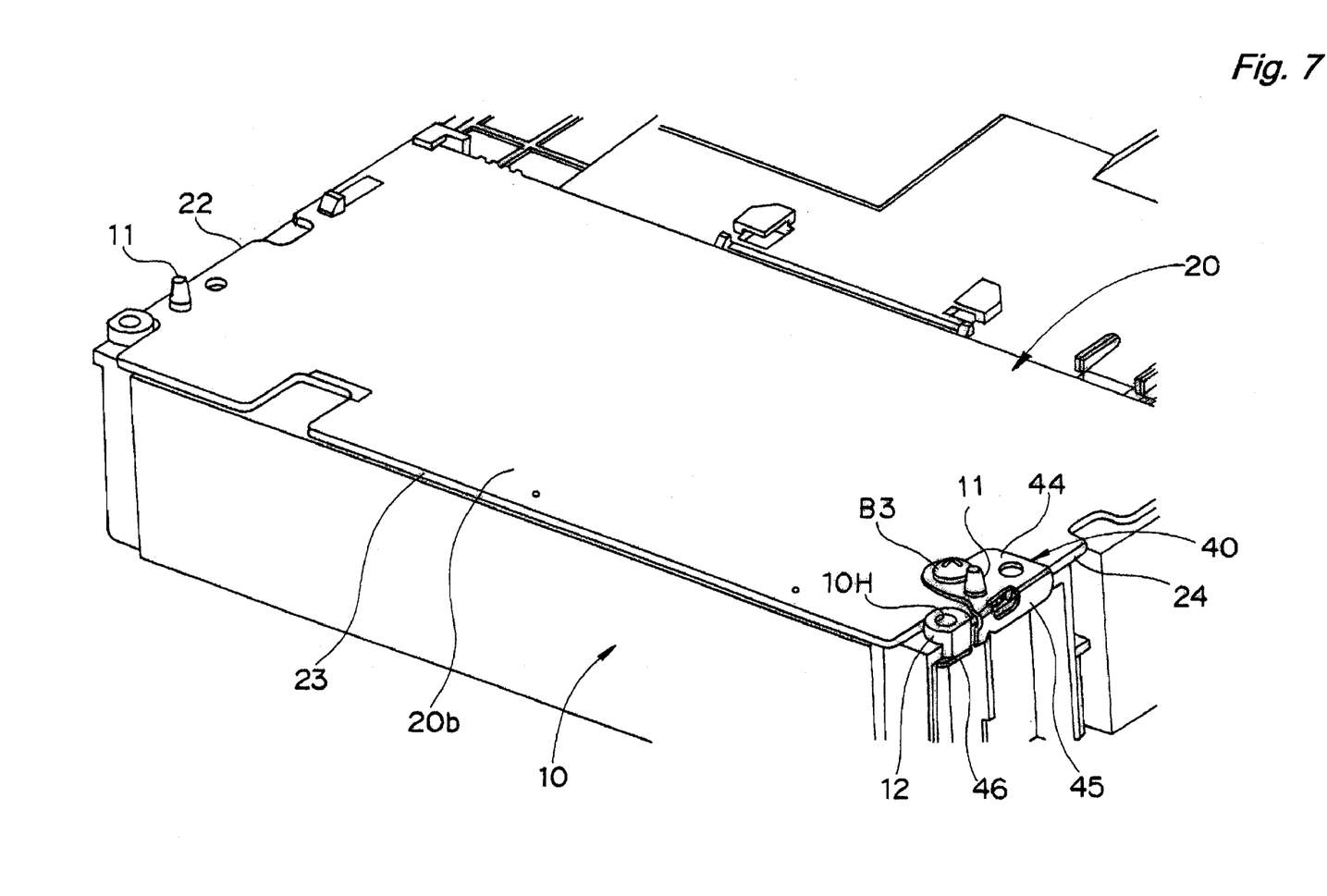
FIG. 7 is a perspective view showing an attachment state of the ground plate to the printed substrate as viewed from the bottom surface side of the substrate.

FIG. 7 is a perspective view showing an attachment state of the ground plate 40 to the printed substrate 20 as viewed from the bottom surface 20b side of the substrate 20. FIGS. 8 to 11 are a series of perspective views for describing a process of attaching the ground plate 40 to the printed substrate 20. Since FIGS. 7 to 11 also show the ground plate 40 and the printed substrate 20 as viewed from the bottom surface 20b side of the printed substrate 20, the ground plate 40 and the printed substrate 20 are shown upside down from their actual top-down position (i.e., FIG. 1).

As shown in FIG. 1, the ground plate 40 according to the present embodiment is attached, for example, to an end portion of the printed substrate 20 that is the opposite side of the attachment position of the heat sink plate 30. The ground plate 40 includes an attachment base portion 44 serving as a base for attaching and fixing the ground plate 40 to the printed substrate 20; and an engaging leg portion 45 that abuts and is secured to a side portion 24 of the substrate 20 when the ground plate 40 is attached to the printed substrate 20. Note that, as with the above-described third engaging hook 35 of the heat sink plate 30, the engaging leg portion 45 may be configured to grip the side portion 24 of the printed substrate 20.

The attachment base portion 44 is formed in a planar shape that contacts with or abuts on the bottom surface 20b of the printed substrate. More preferably, an extended portion 46 is provided to the engaging leg portion 45 so as to extend in parallel with the engaging leg portion 45.

In the mechanical chassis 10, in order to position the printed substrate 20, the aforementioned positioning pins 11 are provided on the bottom surface side in a protruding manner. In the printed substrate 20, the positioning holes 20M that allow the positioning pins 11 to pass therethrough are provided at predetermined locations.

On the other hand, in the attachment base portion 44 of the ground plate 40 is provided a guide groove 44g of a predetermined shape that allows the positioning pin 11 to pass therethrough to engage therewith and is slidably guided by the positioning pin 11 in a predetermined path. The guide groove 44g is similar to the guide groove 34g provided in the aforementioned attachment base portion 34 of the heat sink plate 30.

In addition, in the attachment base portion 44 of the ground plate 40, a fixing portion 47 that fixes the ground plate 40 to the printed substrate 20 is provided. In a portion of the printed substrate 20 corresponding to the fixing portion 47 is provided a pass-through hole 20K that allows a ground plate fixing screw B3 to pass therethrough. In a portion of the mechanical chassis 10 corresponding to the pass-through hole 20K is provided a screw hole (not shown) that allows the ground plate fixing screw B3 to be screwed thereinto. The groove width of the guide groove 44g of the ground plate 40 is also set such that the ground plate fixing screw B3 is allowed to pass through the guide groove 44g.

Note that the fixing portion 47 of the ground plate 40 is similar to the aforementioned fixing portion 37 of the heat sink plate 30, the pass-through hole 20K provided in the printed substrate 20 to allow the ground plate fixing screw B3 to pass therethrough is similar to the aforementioned pass-through hole 20H that allows the heat sink plate fixing screw B1 to pass therethrough, and the screw hole (not shown) provided in the mechanical chassis 10 to allow the ground plate fixing screw B3 to be screwed thereinto is similar to the aforementioned screw hole 10N that allows the heat sink plate fixing screw B1 to be screwed thereinto.

As with the fixing portion 37 of the heat sink plate 30, the fixing portion 47 of the ground plate 40 is located close to an inner end portion of the guide groove 44g, and has a pair of bulges 47b correspond to a screw head portion of the ground plate fixing screw B3, and bulge on the side of the printed substrate 20. In regions of the printed substrate 20 corresponding to the bulges 47b, a terminal (not shown) of a ground circuit of the printed substrate 20 is formed. By the bulges 47b coming into contact with the terminal, the attachment base portion 44 (i.e., the ground plate 40) is electrically connected to the ground circuit of the printed substrate 20. That is, the bulges 47b configure conducting portions that are electrically connected to the printed substrate 20.

As described above, in the mechanical chassis 10, the pass-through holes 10H that allow the chassis fixing metal screws B2 (see FIG. 1) for fixing the chassis 10 to the bottom plate 2 of the casing 1 to pass therethrough are provided at a plurality of required locations (in the present embodiment, four locations, for example). Also, in portions of the bottom plate 2 of the casing 1 corresponding to the pass-through holes 10H are provided the screw holes 2N that allow the chassis fixing screws B2 to be screwed thereinto.

The extended portion 46 of the ground plate 40 extends to a perimeter of the pass-through hole 10H of the mechanical chassis 10, i.e., an end surface of a boss 12 in which the corresponding pass-through hole 10H is provided, and has a pass-through hole 46H that allows the chassis fixing screw B2 to pass therethrough.

By allowing the chassis fixing screw B2 to pass through the pass-through hole 46H of the extended portion 46 and the corresponding pass-through hole 10H of the mechanical chassis 10 and screwing the chassis fixing screw B2 into the screw hole 2N of the bottom plate 2 of the casing 1 and tightening the chassis fixing screw B2, the mechanical chassis 10 can be fastened and fixed to the bottom plate 2 of the casing 1 with the extended portion 46 of the ground plate 40 being sandwiched between a screw head portion of the chassis fixing screw B2 and the end surface of the boss 12. With this configuration, the ground circuit of the printed substrate 20 is electrically connected to the casing 1 and grounded through the ground portion 36 of the heat sink plate 30 and the chassis fixing screw B2.

An attachment procedure for attaching the ground plate 40 configured in the above-described manner to the printed substrate 20 will be described. The attachment procedure is roughly similar to that for the heat sink plate 30.

Figure 8:
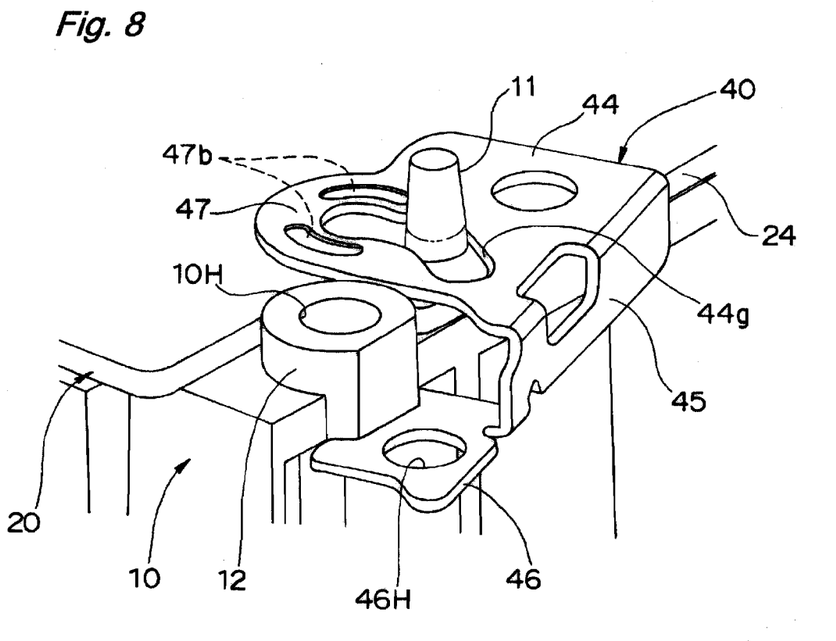
FIG. 8 is one of a series of perspective views for describing a process of attaching the ground plate to the printed substrate.
Figure 9:
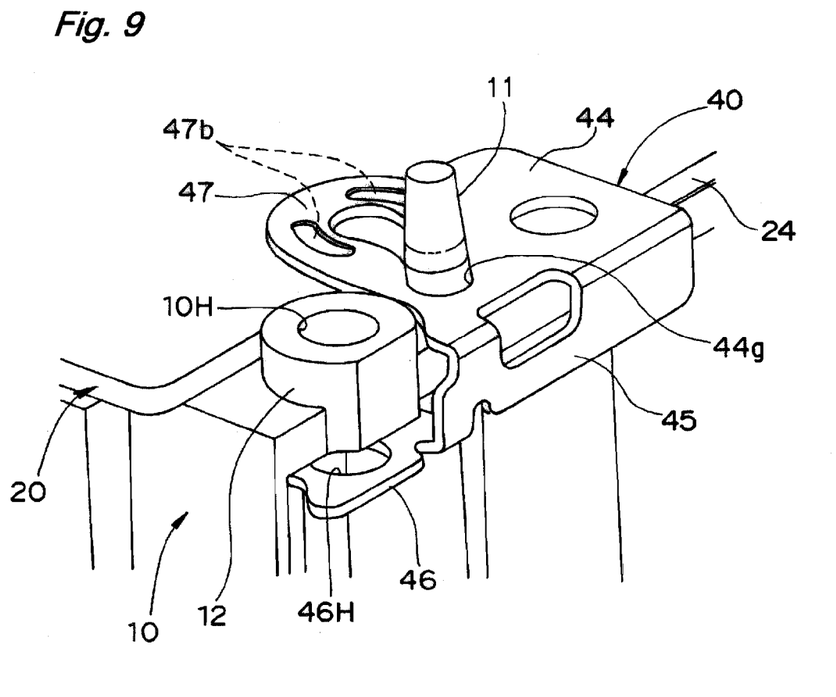
FIG. 9 is one of a series of perspective views for describing the process of attaching the ground plate to the printed substrate.

In an assembling position where the bottom side of the mechanical chassis 10 and the bottom surface 20b of the printed substrate 20 are disposed to face upward, first, from a state in which the ground plate 40 is brought above the bottom surface 20b of the printed substrate 20, the positioning pins 11 of the mechanical chassis 10 are allowed to pass through the positioning holes 20M of the printed substrate 20 and then the positioning pin 11 of the mechanical chassis 10 is allowed to pass through the guide groove 44g of the attachment base portion 44 and be engaged therewith, and the ground plate 40 is shifted to be along the bottom surface 20b of the printed substrate such that the extended portion 46 is located at an outer portion corresponding to the top surface 20a of the printed substrate 20 and a top end surface of a boss 12 of the mechanical chassis 10 (see FIG. 8). In this state, the positioning pin 11 of the mechanical chassis 10 is located, for example, on the way in a longitudinal direction of the guide groove 44g of the ground plate 40.

Then, with the guide groove 44g thus being engaged with the positioning pin 11, the ground plate 40 (more specifically, the attachment base plate 44) is caused to slide along the bottom surface 20b of the printed substrate 20 while being slightly rotated. With this configuration, the guide groove 44g is guided by the positioning pin 11 in a predetermined path (see FIG. 9).

Figure 10:
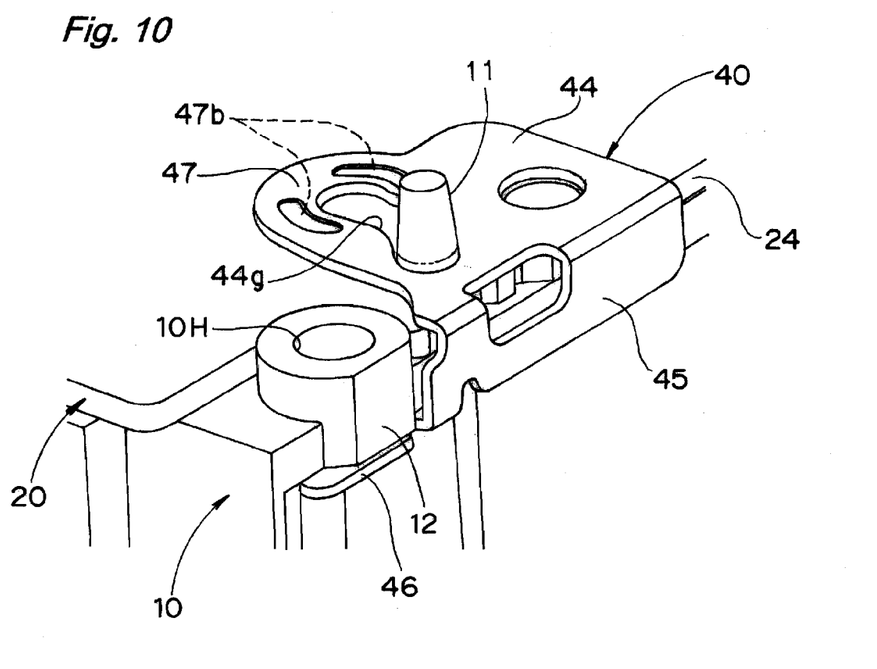
FIG. 10 is one of a series of perspective views for describing the process of attaching the ground plate to the printed substrate.

At this time, the ground plate 40 is continuously caused to slide until the engaging leg portion 45 abuts and is secured to the side portion 24 of the printed substrate 20 (see FIG. 10). With this configuration, the attachment position and direction of the ground plate 40 with respect to the printed substrate 20 can be easily set. At this time, the positioning pin 11 is set to be located close to an outer end portion of the guide groove 44g (i.e., an end portion on the side away from the fixing portion 47 of the ground plate 40).

Figure 11:
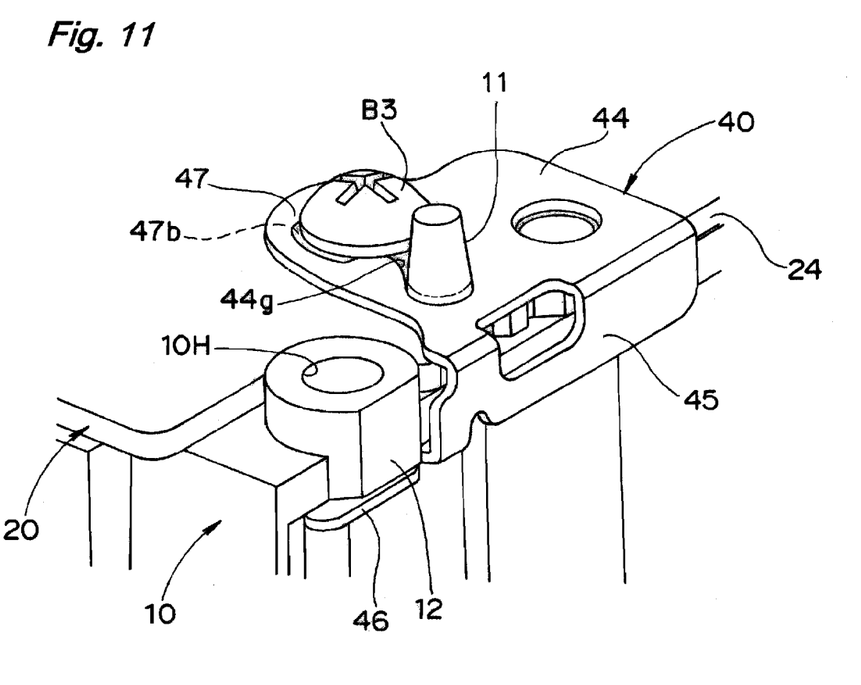
FIG. 11 is one of a series of perspective views for describing the process of attaching the ground plate to the printed substrate.

Then, in such a positioning state, the ground plate fixing screw B3 is allowed to sequentially pass through the guide groove 44g of the ground plate 40 and the pass-through hole 20K of the printed substrate 20 and to be screwed into the screw hole (not shown) of the mechanical chassis 10 and tightened (see FIGS. 11 and 7). With this configuration, the fixing portion 47 of the ground plate 40 is fixed to the printed substrate 20 and the ground plate 40 is attached to the printed substrate 20.

In this case, as with the aforementioned attachment structure of the heat sink plate 30, the ground plate 40, the printed substrate 20, and the mechanical chassis 10 can be tightened together and fixed by a single screwing operation using the ground plate fixing screw B3, enabling to simplify a ground plate fixing operation.

At this time, the positioning pin 11 is located close to the outer end portion of the guide groove 44g while the fixing portion 47 of the ground plate 40 is located close to the inner end portion of the guide groove 44g. Therefore, occurrence of interference between the ground plate fixing screw B3 and the positioning pin 11 when the ground plate 40 is fixed to the printed substrate 20 using the ground plate fixing screw B3 can be easily and securely avoided.

With the ground plate 40 being attached to the printed substrate 20 using the ground plate fixing screw B3 (see FIGS. 11 and 7), the casing 1 (specifically, the bottom plate 2 of the casing 1) is positioned with respect to the mechanical chassis 10 and chassis fixing screws B2 are allowed to pass through the pass-through hole 46H of the extended portion 46 of the ground plate 40 and the pass-through holes 10H of the mechanical chassis 10 and screwed into the screw holes 2N of the bottom plate 2 of the casing 1 and tightened, whereby the mechanical chassis 10 is fastened and fixed to the bottom plate 2 of the casing 1 with the extended portion 46 of the ground plate 40 being sandwiched between a screw head portion of the chassis fixing screw B2 and the end surface of the boss 12.

With this configuration, the ground circuit of the printed substrate 20 is electrically connected to the casing 1 and grounded through the extended portion 46 of the ground plate 40 and the chassis fixing screw B2.

As described above, according to the present embodiment, when the ground plate 40 is attached to the printed substrate 20, substantially similar functions and effects as those obtained when the aforementioned heat sink plate 30 is attached can be obtained.

Note that since, as described above, in the present embodiment the dedicated ground plate 40 is attached, it is not indispensable to provide the double-use ground portion 36 to the heat sink plate 30 in addition to the ground plate 40, and the printed substrate 20 can be securely grounded only by the dedicated ground plate 40. Alternatively, conversely, without attaching the dedicated ground plate 40, the printed substrate 20 can also be securely grounded only by the double-use ground portion 36 provided to the heat sink plate 30.

Figure 12:
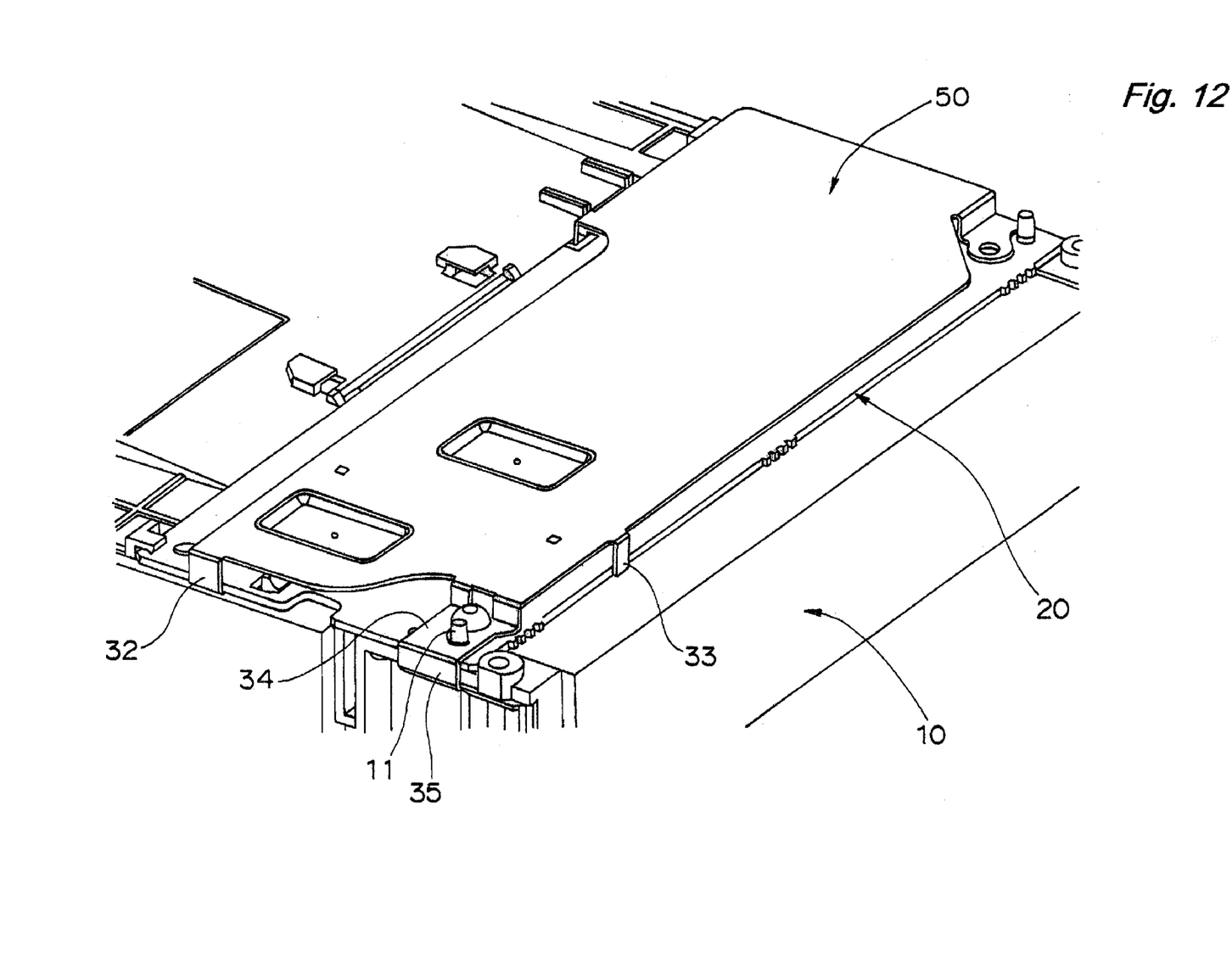
FIG. 12 is a perspective view showing an attachment state of a heat sink plate of a long type to the printed substrate as viewed from the bottom surface side of the substrate.

Although in the above-described embodiment the heat sink plate 30 is of a so-called short type that covers a partial region of the printed substrate 20, even when a heat sink plate 50 of a so-called long type that covers substantially the entire region of the printed substrate 20, such as that shown in FIG. 12, is attached to the printed substrate 20, by providing the aforementioned first, second, and third engaging hooks 32, 33, and 35, attachment base portion 34, etc., and using the positioning pins 11 of the mechanical chassis 10, etc., similar attachment structure to that in the aforementioned embodiment can be applied.

The present invention can be used in an attachment structure of an attached-plate of a substrate for attaching attached-plates, such as a heat sink plate and a ground plate, of a printed substrate which is installed in a chassis of an electrical appliance, e.g., a disk apparatus, to the printed substrate. Attached-plates, such as a heat sink plate and a ground plate, can be attached to a printed substrate without exerting undue force to the heat sink plate and the printed substrate and without requiring an additional extra component.

It is to be noted that the present invention is not limited to the above-described embodiment and various changes and modifications may be made thereto without departing from the spirit and scope of the present invention.

What is claimed is:

1. An attachment structure of an attached-plate of a substrate for attaching an attached-plate of a printed substrate which is installed in a chassis, to the printed substrate, wherein the chassis includes a positioning pin for positioning at least the printed substrate with respect to the chassis, said attached-plate comprising:

a guide groove of a predetermined shape configured to engage the positioning pin and to be slidably guided by the positioning pin in a predetermined path;

an attached-plate fixing portion configured to fix said attached-plate to the printed substrate; and an engaging portion configured to engage a side portion of the printed substrate;

wherein when said attached-plate slides along one side of the printed substrate with said guide groove engaged with the positioning pin, said guide groove is guided by the positioning pin in the predetermined path, whereby said engaging portion engages with the side portion of the printed substrate;

wherein in an engagement state, by fixing said attached-plate fixing portion to the printed substrate, the attached-plate is directly attached to the printed substrate, wherein said chassis comprises a first screw hole, said printed substrate comprises a pass-through hole, and said attached-plate fixing portion comprises a second screw hole, wherein a screw member passes through said first screw hole, said pass-through hole and said second screw hole.

2. The attachment structure of an attached-plate of a substrate according to claim 1, wherein said attached-plate fixing portion is disposed at one-end side of said guide groove.

3. The attachment structure of an attached-plate of a substrate according to claim 1, wherein the chassis is disposed in a casing;

in respective portions of the casing and the printed substrate corresponding to the positioning pin are respectively provided positioning portions that are matched with the positioning pin; and said engaging groove is configured and arranged to engage the positioning pin to thereby guide a sliding operation of said attached-plate along the one side of the printed substrate, the positioning pin being capable of being matched with the positioning portions and thereby position the casing and the printed substrate with respect to the chassis.

4. The attachment structure of an attached-plate of a substrate according to claim 1, wherein said engaging portion includes a leg portion that abuts and is secured to a side surface of the printed substrate when engaging the side portion of the printed substrate, and a latching hook that is latched to another side of the printed substrate upon engagement of said engagement portion with the printed substrate; and when said engaging portion engages the side portion of the printed substrate, in a positioning state where said leg portion abuts and is secured to the side surface of the printed substrate from a side, said latching hook is latched to the another side of the printed substrate.

5. The attachment structure of an attached-plate of a substrate according to claim 4, wherein said engaging portion is disposed at three predetermined locations of said attached-plate and positions of said engaging portion at said three predetermined locations are set such that said engaging portion is not arranged in one straight line.

6. The attachment structure of an attached-plate of a substrate according to claim 5, wherein at least one of said three predetermined locations of said engaging portion further includes a sliding wall portion configured to slide along the one side of the printed substrate; and when the engaging portion engages with side portions of the printed substrate, in a positioning state where the leg portion abuts and is secured to side surfaces of the printed substrate from a side, said sliding wall portion and said latching hook sandwich at least the printed substrate in a thickness direction.

7. The attachment structure of an attached-plate of a substrate according to claim 1, wherein the chassis is a resin and said attached-plate is a metal heat sink plate that is configured to promote heat sinking of a temperature-rise element on the printed substrate.

8. The attachment structure of an attached-plate of a substrate according to claim 7, wherein, in a portion of said heat sink plate corresponding to the temperature-rise element, an elastic element is disposed that is arranged so as to come into contact with a surface of the temperature-rise element and thereby promote heat sinking of the temperature-rise element.

9. The attachment structure of an attached-plate of a substrate according to claim 8, wherein said elastic element is formed in a sheet or film form.

10. The attachment structure of an attached-plate of a substrate according to claim 9, wherein said engaging portion is disposed at three predetermined locations of said attached-plate and positions of said engaging portion at said three predetermined locations are set such that said engaging portion is not arranged in one straight line.

11. The attachment structure of an attached-plate of a substrate according to claim 7, wherein
the chassis is accommodated in a metal casing;
a pass-through hole is disposed in the chassis, the pass-through hole allowing a chassis fixing metal screw member for fixing the chassis to the casing to pass therethrough, and in a portion of the casing corresponding to the pass-through hole, a screw hole is disposed that allows the chassis fixing screw member to be screwed thereinto;
said heat sink plate includes a conducting portion configured to electrically connect to the printed substrate, and an extended portion configured to extend a perimeter of the pass-through hole of the chassis; and
by allowing the chassis fixing screw member to pass through the pass-through hole of the chassis and allowing the chassis fixing screw member to be screwed into the screw hole of the casing, the printed substrate is capable of being electrically connected to the casing and grounded through said extended portion of said heat sink plate and the chassis fixing screw member.

12. The attachment structure of an attached-plate of a substrate according to claim 1, wherein
the chassis is a resin and is accommodated in a metal casing;
said attached-plate is a metal ground plate that is capable of grounding the printed substrate;
a pass-through hole is disposed in the chassis, the pass-through hole allowing a chassis fixing metal screw member for fixing the chassis to the casing to pass therethrough, and in a portion of the casing corresponding to the pass-through hole a screw hole is disposed that allows the chassis fixing screw member to be screwed thereinto;
said ground plate includes a conducting portion configured to electrically connect to the printed substrate, and an extended portion configured to extend a perimeter of the pass-through hole; and
by allowing the chassis fixing screw member to pass through the pass-through hole of the chassis and allowing the chassis fixing screw member to be screwed into the screw hole of the casing, the printed substrate is capable of being electrically connected to the casing and grounded through said ground plate and the chassis fixing screw member.

13. The attachment structure of an attached-plate of a substrate according to claim 1, wherein
said engaging portion includes a leg portion that abuts and is secured to a side surface of the printed substrate when engaging the side portion of the printed substrate, and a latching hook that is latched to another side of the printed substrate upon engagement of said engagement portion with the printed substrate; and
when said engaging portion engages the side portion of the printed substrate, in a positioning state where said leg portion abuts and is secured to the side surface of the printed substrate from a side, said latching hook is latched to the another side of the printed substrate.

14. The attachment structure of an attached-plate of a substrate according to claim 3, wherein
said engaging portion includes a leg portion that abuts and is secured to a side surface of the printed substrate when engaging the side portion of the printed substrate, and a latching hook that is latched to another side of the printed substrate upon engagement of said engagement portion with the printed substrate; and
when said engaging portion engages the side portion of the printed substrate, in a positioning state where said leg portion abuts and is secured to the side surface of the printed substrate from a side, said latching hook is latched to the another side of the printed substrate.

15. The attachment structure of an attached-plate of a substrate according to claim 1, wherein the chassis is a resin and said attached-plate is a metal heat sink plate that is configured to promote heat sinking of a temperature-rise element on the printed substrate.

16. The attachment structure of an attached-plate of a substrate according to claim 3, wherein the chassis is a resin and said attached-plate is a metal heat sink plate that is configured to promote heat sinking of a temperature-rise element on the printed substrate.

17. The attachment structure of an attached-plate of a substrate according to claim 4, wherein the chassis is a resin and said attached-plate is a metal heat sink plate that is configured to promote heat sinking of a temperature-rise element on the printed substrate.

18. The attachment structure of an attached-plate of a substrate according to claim 1, wherein
the chassis is a resin and is disposed in a metal casing;
said attached-plate is a metal ground plate that is capable of grounding the printed substrate;
a pass-through hole is disposed in the chassis, the pass-through hole allowing a chassis fixing metal screw member for fixing the chassis to the casing to pass therethrough, and in a portion of the casing corresponding to the pass-through hole a screw hole is disposed that allows the chassis fixing screw member to be screwed thereinto;
said ground plate includes a conducting portion configured to electrically connect to the printed substrate, and an extended portion configured to extend a perimeter of the pass-through hole; and
by allowing the chassis fixing screw member to pass through the pass-through hole of the chassis and allowing the chassis fixing screw member to be screwed into the screw hole of the casing, the printed substrate is capable of being electrically connected to the casing and grounded through said ground plate and the chassis fixing screw member.

19. The attachment structure of an attached-plate of a substrate according to claim 3, wherein
the chassis is a resin and is disposed in a metal casing;
said attached-plate is a metal ground plate that is capable of grounding the printed substrate;
a pass-through hole is disposed in the chassis, the pass-through hole allowing a chassis fixing metal screw member for fixing the chassis to the casing to pass therethrough, and in a portion of the casing corresponding to the pass-through hole is a screw hole is disposed that allows the chassis fixing screw member to be screwed thereinto;
said ground plate includes a conducting portion configured to electrically connect to the printed substrate, and an extended portion configured to extend a perimeter of the pass-through hole; and
by allowing the chassis fixing screw member to pass through the pass-through hole of the chassis and allowing the chassis fixing screw member to be screwed into the screw hole of the casing, the printed substrate is capable of being electrically connected to the casing and grounded through said ground plate and the chassis fixing screw member.

20. The attachment structure of an attached-plate of a substrate according to claim 4, wherein
the chassis is a resin and is disposed in a metal casing;
said attached-plate is a metal ground plate that is capable of grounding the printed substrate;
a pass-through hole is disposed in the chassis, the pass-through hole allowing a chassis fixing metal screw member for fixing the chassis to the casing to pass therethrough, and in a portion of the casing corresponding to the pass-through hole is a screw hole is disposed that allows the chassis fixing screw member to be screwed thereinto;
said ground plate includes a conducting portion configured to electrically connect to the printed substrate, and an extended portion configured to extend a perimeter of the pass-through hole; and
by allowing the chassis fixing screw member to pass through the pass-through hole of the chassis and allowing the chassis fixing screw member to be screwed into the screw hole of the casing, the printed substrate is capable of being electrically connected to the casing and grounded through said ground plate and the chassis fixing screw member.

21. The attachment structure of an attached-plate of a substrate according to claim 7, wherein
the chassis is disposed in a metal casing;
said attached-plate is a metal ground plate that is capable of grounding the printed substrate;
a pass-through hole is disposed in the chassis, the pass-through hole allowing a chassis fixing metal screw member for fixing the chassis to the casing to pass therethrough, and in a portion of the casing corresponding to the pass-through hole is a screw hole is disposed that allows the chassis fixing screw member to be screwed thereinto;
said ground plate includes a conducting portion configured to electrically connect to the printed substrate, and an extended portion configured to extend a perimeter of the pass-through hole; and
by allowing the chassis fixing screw member to pass through the pass-through hole of the chassis and allowing the chassis fixing screw member to be screwed into the screw hole of the casing, the printed substrate is capable of being electrically connected to the casing and grounded through said ground plate and the chassis fixing screw member.

* * * * *